United States Patent [19]
Zakel et al.

[11] Patent Number: 5,956,232
[45] Date of Patent: Sep. 21, 1999

[54] CHIP SUPPORT ARRANGEMENT AND CHIP SUPPORT FOR THE MANUFACTURE OF A CHIP CASING

[75] Inventors: Elke Zakel, Falkensee; David Lin, Berlin; Jörg Gwiasda, Berlin; Andreas Ostmann, Berlin, all of Germany

[73] Assignee: Fraunhofer-Gesellschaft zur Forderung der Angewandten Forschung E.V.

[21] Appl. No.: 08/836,721
[22] PCT Filed: Dec. 7, 1995
[86] PCT No.: PCT/DE95/01780
§ 371 Date: Jun. 25, 1997
§ 102(e) Date: Jun. 25, 1997
[87] PCT Pub. No.: WO96/21947
PCT Pub. Date: Jul. 18, 1997

[30] Foreign Application Priority Data

Jan. 12, 1995 [DE] Germany ................ 195 00 655

[51] Int. Cl.[6] .................................................. H05K 7/02
[52] U.S. Cl. .................... 361/760; 361/728; 361/805; 361/807; 361/809; 361/813; 361/820; 257/666; 257/684; 257/690; 257/673; 257/676; 257/735; 257/736; 257/737; 257/782; 228/186.21; 228/180.22
[58] Field of Search ....................... 361/760, 728, 361/805, 807, 809, 813, 820; 257/666, 684, 690, 668, 667, 673, 676, 735, 736, 737, 779, 778, 782, 723, 724, 734; 228/180.21, 180.22, 39; 174/52.4, 260, 261

[56] References Cited

U.S. PATENT DOCUMENTS

| | | |
|---|---|---|
| 4,736,882 | 4/1988 | Winter et al. ................ 228/180.22 |
| 4,912,547 | 3/1990 | Bilowith et al. . |
| 4,967,313 | 10/1990 | Berner . |
| 5,073,817 | 12/1991 | Ueda . |
| 5,162,896 | 11/1992 | Takubo et al. ................ 257/664 |

(List continued on next page.)

FOREIGN PATENT DOCUMENTS

| | | |
|---|---|---|
| 38 14 469 | 11/1988 | Germany . |
| 0343 400 | 11/1989 | Germany . |
| 38 24 008 | 1/1990 | Germany . |
| 0684 644 | 11/1995 | Germany . |

OTHER PUBLICATIONS

International Search Report.
Thin Film Module, IBM Technical DIsclosure Bulletin, vol. 31, No. 8, Jan. 1989, pp. 135–138.
Improved Method for C–4 Chip Join, IBM Technical DIsclosure Bulletin, vol. 31, No. 6, Nov. 1998, pp. 335–336.
Process for Manufacturing A Double Dense Tab Package Using Solder, IBM Technical Disclosure bulletin, vol. 33, No. 5, Oct. 1990, pp. 424–425.

(List continued on next page.)

*Primary Examiner*—Leo P. Picard
*Assistant Examiner*—David Foster
*Attorney, Agent, or Firm*—Darby & Darby

[57] ABSTRACT

Chip-support arrangement (23) with a chip support (23) for the manufacture of a chip casing, said chip support being provided on a support foil (20) with conducting paths (21) which are connected on the front side of the support foil facing a chip (39) to contact-surface metallizations (40) of the chip and which with their free ends form a connection-surface arrangement (42) distributed in planar manner for the purpose of connection to an electronic component or a substrate, whereby the conducting paths (21) are arranged on the reverse side of the support foil (20), recesses (28) in the support foil (20) are provided in the region of the contact-surface metallizations (40), the conducting paths for forming the connection-surface arrangement (42) are covered with a perforated mask (36) and the thickness (s) of the support foil is smaller than or substantially equal to the height (h) of the contact-surface metallizations (40) on the surface of the chip.

11 Claims, 9 Drawing Sheets

U.S. PATENT DOCUMENTS

| | | |
|---|---|---|
| 5,218,168 | 6/1993 | Mitchell et al. . |
| 5,289,346 | 2/1994 | Carey et al. . |
| 5,350,947 | 9/1994 | Takekawa et al. . |
| 5,367,763 | 11/1994 | Lam . |
| 5,389,739 | 2/1995 | Mills .................................... 174/52.4 |
| 5,409,865 | 4/1995 | Karnezos ................................ 437/210 |
| 5,673,479 | 10/1997 | Hawthorne ............................... 29/832 |

OTHER PUBLICATIONS

Area Array Chip Carrier: SMT Package for Known Good Die, Proceedings of the 1993 International Symposium on Microelectronics (ISHM), Dallas, pp. 318–323.

Semiconductor Integrated Circuit Device and Manufacture, Patent Abstracts of Japan, JP 3 116 838.

International Preliminary Examination Report.

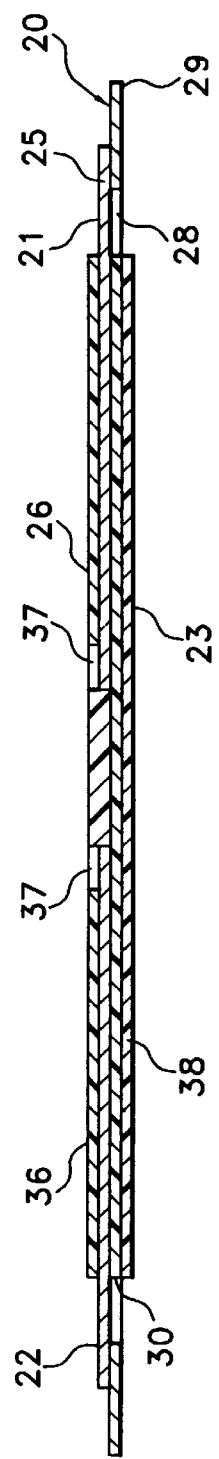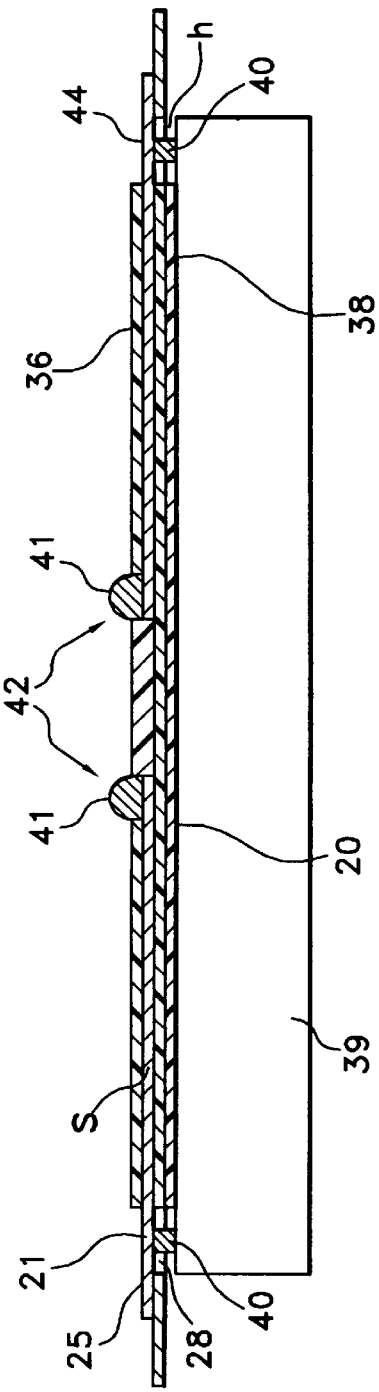

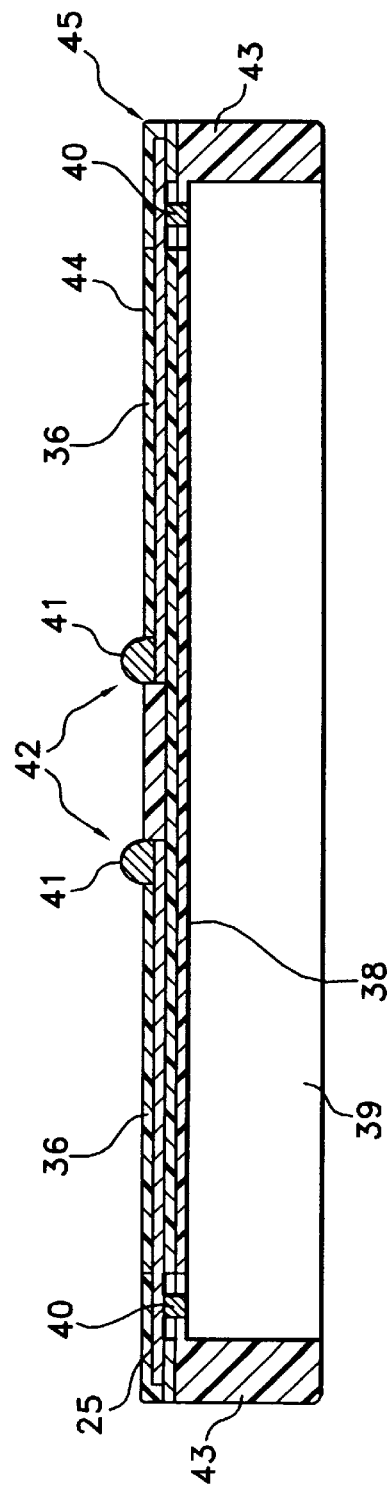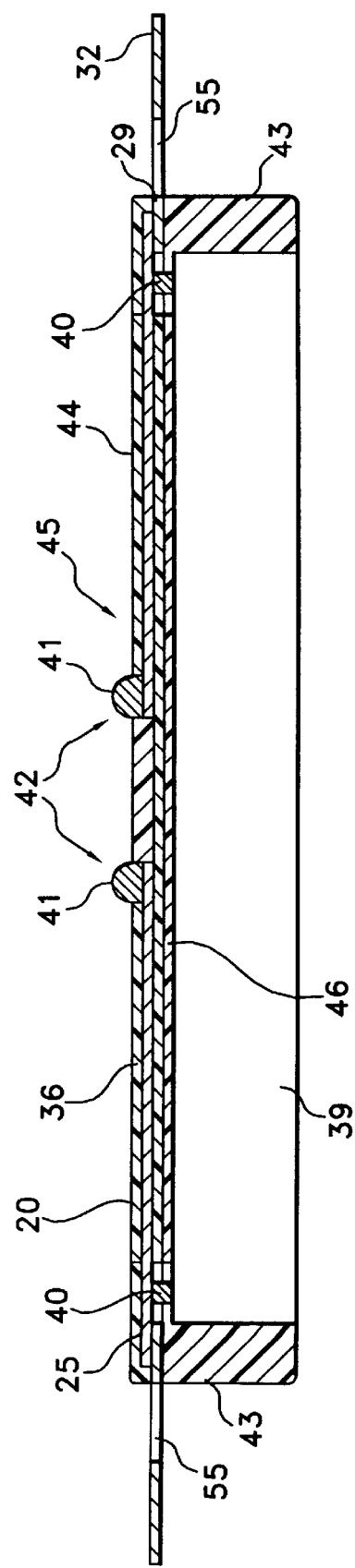

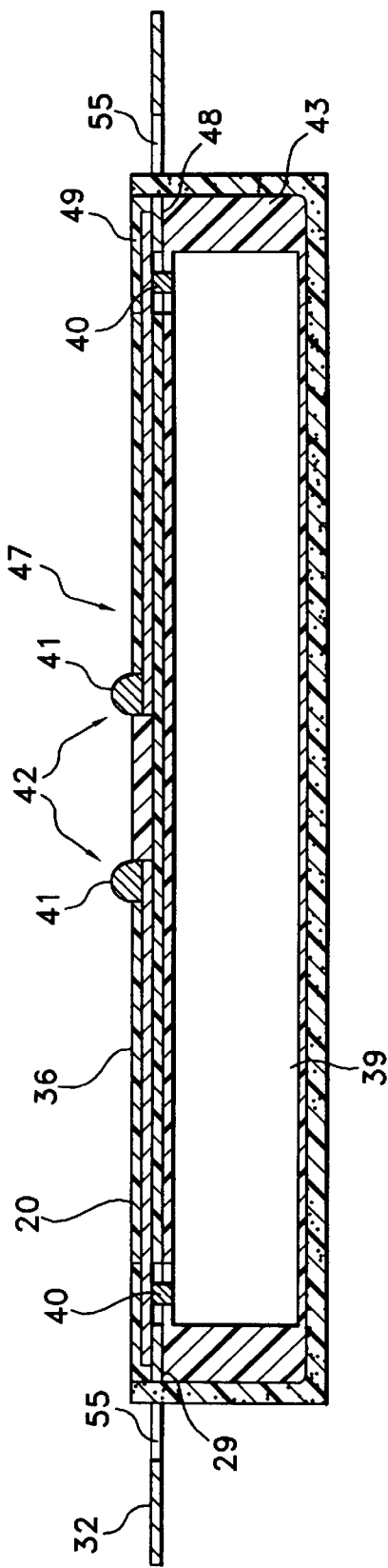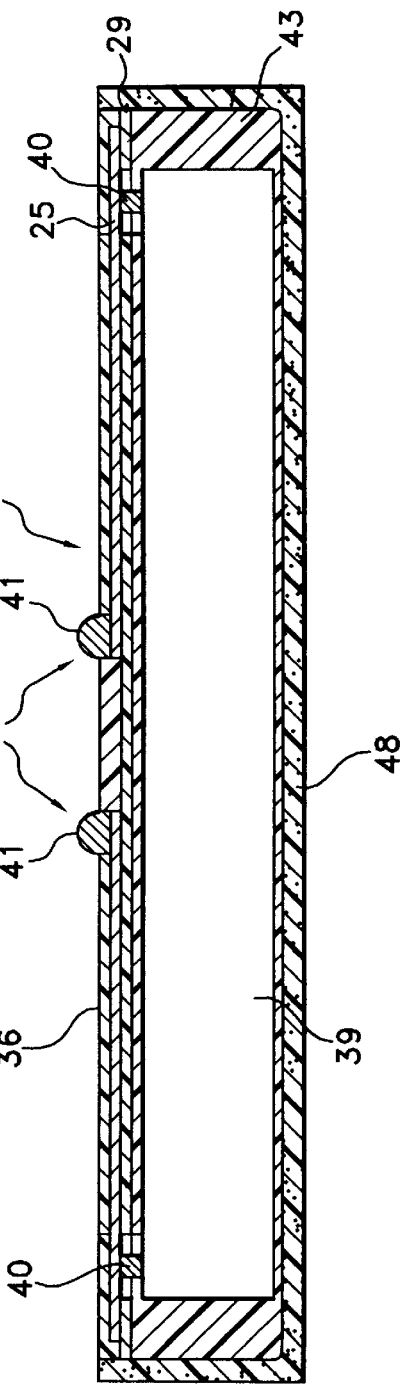

CHIP SUPPORT ARRANGEMENT AND CHIP SUPPORT FOR THE MANUFACTURE OF A CHIP CASING

BACKGROUND OF THE INVENTION

The present invention relates to a chip-support arrangement with a chip support for the manufacture of a chip casing, said chip support being provided on a support foil with conducting paths which are connected on the front side of the support foil facing a chip to contact-surface metallizations of the chip and which with their free ends form a connection-surface arrangement distributed in planar manner for the purpose of connection to an electronic component or a substrate. The invention further relates to a chip support for the manufacture of a chip casing having a support foil comprising conducting paths.

With a view to protection against undesirable mechanical and chemical influences and also with a view to removing and distributing dissipated heat, as a rule it is necessary to provide chips with a casing. This casing furthermore offers the advantage that, by virtue of a connection-conductor arrangement that is guided from the chip-connection surfaces to the outside, an improvement in the handling of the chip in the course of subsequent mounting is achieved, since by means of the connection-conductor arrangement that is guided to the outside an enlargement of the connection surfaces is created and by means of an outwardly spreading configuration of the connection-conductor arrangement larger interspaces between the connection surfaces that are accessible from outside are created. With the surface-mounted technology (SMT) that is widespread nowadays it is therefore customary to make use of a casing made of plastic, ceramic or metal in which the external connection-conductor arrangement or connection-surface arrangement is realised by means of a plurality of connection pins projecting outwards (pin-grid array, PGA). With such casings the chips are arranged on a chip support that is many times larger than the chip itself, in order to be able to form on the chip support the connection-conductor arrangement described above. This results in a design of the chip casing which is voluminous overall and which proves disadvantageous, particularly in connection with the multi-chip module technology that is finding increasing application.

This recognised disadvantage was, inter alia, one reason for developing a chip casing, which is characterised in that the chip support itself together with its connection-conductor arrangement has roughly the same size as the chip. This was achieved by creating a chip support comprising a support foil made of polyimide which is provided on one side with connection conductors which at their free ends protruding beyond the support foil are connected to the chip-connection surfaces and at their end regions arranged on the support foil are connected in each given case to a contact metallization arranged on the opposite side of the support foil. By virtue of an arrangement of the contact metallizations distributed in planar manner on the opposite side of the support foil facing away from the chip a contact-metallization arrangement known by the expression "ball-grid array" is created which replaces the conventional connection conductor-pin arrangement (PGR) that is directed outwards.

Although this "internal" connection-conductor arrangement located in the region of the surface of the chip results overall in a substantially more compact design of the chip casing, with the known chip casing it is necessary to provide an additional insulating interlayer between the conductors and the surface of the chip. This interlayer makes it necessary, inter alia, that, with a view to connecting the conductor arrangement to the chip-connection surfaces, the ends of the individual conductors have to be bent out of the plane of the support foil in order to come into contact with the chip-connection surfaces. This makes it impossible, with a view to manufacture of the known chip casing, to make use of one of the known connection processes such as, for example, the tape-automated bonding (TAB) process or the flip-chip process.

Hence the object underlying the present invention is to create a chip casing which, in comparison with the known chip casing, makes possible a simplified structure and the use of conventional connection technologies for manufacture of the chip casing.

SUMMARY OF THE INVENTION

This object is achieved by means of a chip-support arrangement.

In which the conducting paths are located on the reverse side of the support foil, whereby recesses in the support foil are provided in the region of the contact metallizations, the thickness of the support foil is smaller than or substantially equal to the height of the contact-surface metallizations on the surface of the chip, and the conducting paths for forming the connection-surface arrangement are covered with a perforated mask. It is expressly pointed out that the term "support foil" here is used to describe a support body that is thin in relation to its surface extent and, depending on the choice of material for the support body, encompasses both relatively rigid and flexible support bodies.

The chip-support arrangement according to the invention enables in the course of its manufacture a connection of the chip support to the chip, optionally with the aid of the TAB process or the flip-chip process. By reason of the structure according to the invention it is possible to connect the conducting paths from the reverse side of the support foil with the aid of a thermode, as is customary in the TAB process, to the contact-surface metallizations of the chip without the conducting paths having to be bent out of the plane of the support film in the process. In this case it is then possible for a connecting contact between contact sections of the conducting paths and the contact-surface metallizations of the chip to be effected in the region of recesses in the support foil. The thickness of the support foil that is matched to the height of the contact-surface metallizations enables contact to be made without warping of the chip support, whereby the support foil facing the surface of the chip serves at the same time by way of insulation of the conducting paths in relation to the surface of the chip. With correspondingly thick design of the support foil the support foil can also function as an elastic interlayer between the surface of the chip and the support foil that is provided with the conducting paths, in order to constitute an insulation against vibration.

It proves particularly advantageous if, with a view to forming a contact-surface metallization on the connection-surface arrangement, balls of solder are applied in holes in the perforated mask which are intended for this purpose. In this regard the perforated mask may also be constructed as a so-called solder-stop mask which prevents the solder balls from running together in the course of remelting for the purpose of connection to an electronic component and a substrate. The application of solder balls constitutes a particularly cost-effective process for the generation of solder bumps.

It is also advantageous if at least one interspace present between the support foil and the surface of the chip is provided with a filler connecting the support foil and the chip to one another adhesively. By this means a unit is formed which is constituted by chip and chip support adhering securely to one another.

If the chip support and the chip are accommodated in a case which is formed, for example, from synthetic material, whereby the adhesive filler fills out interspaces between the inner wall of the case and the chip support as well as the chip, a chip casing is created in which the chip is securely screened on all sides. Furthermore, in this case the reverse side of the case which is arranged opposite the chip support constitutes an inscription area.

In accordance with the invention a chip support for the manufacture of a chip-support arrangement with the chip support is disclosed for the manufacture of a chip casing. The chip support is provided on a support foil with conducting paths which are connected on the front side of the support foil facing a chip to contact-surface metallizations of the chip and which, with their free ends, form a contact-surface arrangement distributed in planar manner for the purpose of connection to an electronic component or a substrate. The conducting paths are arranged on the reverse side of the support foil, with recesses in the support foil are provided in the region of the contact-surface metallizations, and, with a view to forming the connection-surface arrangement, the conducting paths are covered with a perforated mask, such that the thickness of the support foil is smaller than or substantially equal to a height h of the contact-surface metallizations on the surface of the chip.

In one embodiment, with a view to forming a contact-surface metallization on the connection-surface arrangement, solder balls are applied in holes in the perforated mask. In another embodiment, with a view to forming a chip casing, at least one interspace that is present between the support foil and the surface of the chip is provided with a filler. Also, with a view to forming a chip casing, the chip support and the chip are accommodated in a case, such that interspaces present between an inner wall of the case and the chip support and also the chip and the chip support are filled out by the filler.

Further, the chip support according to the present invention for the manufacture of a chip-support arrangement has a support foil with conducting paths, such that the conducting paths are arranged in the manner of a sandwich at least in a partial region between the support foil and a perforated mask which serves to form a connection-surface arrangement on inner end regions of the conducting paths In another embodiment, with a view to forming a contact-surface metallization on the connection-surface arrangement, solder balls are applied in holes in the perforated mask.

In other embodiments of the invention, the conducting paths are exposed on a chip-contact side in the region of contact sections. In addition, the conducting paths are exposed on both sides in the region of contact sections. The contact sections may also merge with outer end regions of the conducting paths that terminate in contact surfaces and are arranged so as to diverge in the direction of the contact surfaces.

According to further alternative embodiments of the present invention, the support foil adjacent to the contact sections includes a peripheral foil gap in such a way that an inner region of the support foil is connected to an outer region of the support foil via several target-separation devices. In the alternative embodiment, the support foil includes conducting paths which, proceeding from the contact sections, have outer end regions that extend over the foil gap as far as the outer region of the support foil.

In the case of the chip support according to the invention the conducting paths are arranged, at least in a partial region, in the manner of a sandwich between the support foil and a perforated mask that serves to form a connection-surface arrangement on the inner end regions of the conducting paths.

In order to enable continuous manufacture of chip casings it proves to be advantageous if the chip support is constructed as a foil strip, the partial regions each being assigned to a chip.

A particularly cost-effective possibility for forming a contact-surface metallization on the connection-surface arrangement is provided if solder balls are applied in holes in the perforated mask which are intended for this purpose. These can then be remelted with the aid of the reflow process when they are connected to an electronic component or a substrate. The solder balls in the perforated mask can be applied before or after the connection of the chip support to the chip.

If the conducting paths on the support foil are exposed in the region of contact sections on a chip-contact side, this is sufficient to bring about a contact of the chip support with the aid of the flip-chip process, in connection with which the chips are mounted, with, for example, their contact-surface metallizations downward, onto the chip support which passes through below the chip at regular intervals. In the case where chip support and chip are contacted with the aid of the flip-chip process the perforated mask may be not only of intermittent design but also continuous, since no access to the conducting paths from the reverse side of the support foil is necessary.

If the conducting paths of the chip support are exposed on both sides in the region of contact sections—that is to say, both on the front side (chip-contact side) and on the reverse side of the support foil—a connection of the chip support to the chip can be implemented by subjecting the contact sections to the action of a thermode or similar device from the reverse side of the support foil with the aid of the TAB process. In this case the perforated mask is then, as mentioned above, constructed in partial regions, whereby the individual partial regions may also be of coherent design—that is to say, separated merely, for example, by a perforation exposing the contact sections of the conducting paths.

It is also advantageous if the conducting paths are constructed in such a way that the contact sections thereof merge with outer end regions that terminate in connection surfaces and are arranged so as to diverge in the direction of the connection surfaces. By this means, besides "internal" contacting on the connection-surface arrangement on the reverse side of the support foil, "external" contacting of the chip also becomes possible, whereby at the same time by virtue of the outwardly spreading arrangement of the external connection surfaces and the enlarged connection surfaces made possible thereby, precise contacting, for quality-testing purposes for example, is substantially alleviated.

If the support foil comprises a peripheral foil gap adjacent to the contact sections in such a way that via several target-separation devices an inner region of the support foil is connected to an outer region of the support foil, after completion of coherent chip-support arrangements or chip casings a rapid and simple isolation, by stamping for example, is possible.

In the case of outer end regions of the conducting paths in the outer region of the support foil which extend over the foil gap, prior to the isolation a test contact can be made in rapid and simple manner.

BRIEF DESCRIPTION OF THE DRAWING FIGURES

The invention is elucidated in more detail below by representation of an embodiment of a chip support and also several embodiments of a chip casing with reference to the drawings. Illustrated are:

FIG. 1 a sectional representation of a chip support with a support foil and conducting paths arranged thereon;

FIG. 2 a top view of the chip support represented in FIG. 1;

FIG. 3 the chip support represented in FIG. 1, wherein the ends of the conducting paths thereof are connected to contact-surface metallizations of a chip in order to form a chip-support arrangement;

FIG. 4 in a top view, the chip-support arrangement represented in FIG. 3;

FIG. 5 the chip-support arrangement represented in FIG. 4 with application of solder balls on inner end regions of the conducting paths;

FIG. 6 in a top view, the chip-support arrangement represented in FIG. 5;

FIG. 7 the chip-support arrangement represented in FIG. 5, with a plastic cast seal;

FIG. 8 the chip-support arrangement represented in FIG. 7, with an underfilling provided between the chip support and the surface of the chip;

FIG. 9 a chip casing with a plastic case;

FIG. 10 an isolated chip casing that has been removed from the support foil;

FIG. 11 a representation of the inner region of a support foil represented in FIG. 2 in combination with an outer region of the support foil;

FIG. 12 a variation on the support foil represented in FIG. 11 with conducting paths that are extended by outer end regions as far as the outer region of the support foil with a view to forming test-connection surfaces.

According to the present invention, in illustrated embodiments shown in FIGS. 1–12, a chip-support arrangement with a chip support is disclosed for the manufacture of a chip casing. The chip support is provided on a support foil with conducting paths which are connected on the front side of the support foil facing a chip to contact-surface metallizations of the chip and which, with their free ends, form a contact-surface arrangement distributed in planar manner for the purpose of connection to an electronic component or a substrate. The conducting paths 21, 52 are arranged on the reverse side of the support foil 20, 50, with recesses 28 in the support foil 20, 50 are provided in the region of the contact-surface metallizations 40, and, with a view to forming the connection-surface arrangement 42, the conducting paths 21, 52 are covered with a perforated mask 36, such that the thickness of the support foil 20, 50 is smaller than or substantially equal to a height h of the contact-surface metallizations 40 on the surface of the chip.

In one embodiment, with a view to forming a contact-surface metallization on the connection-surface arrangement 42, solder balls 41 are applied in holes 37 in the perforated mask 36. In another embodiment, with a view to forming a chip casing 45, at least one interspace that is present between the support foil 20, 50 and the surface of the chip 39 is provided with a filler 38, 46. Also, with a view to forming a chip casing 47, the chip support 23 and the chip 39 are accommodated in a case 48, such that interspaces present between an inner wall 49 of the case and the chip support 23 and also the chip 39 and the chip support 23 are filled out by the filler 38.

Further, the chip support according to the present invention for the manufacture of a chip-support arrangement has a support foil with conducting paths, such that the conducting paths 21, 52 are arranged in the manner of a sandwich at least in a partial region between the support foil 20, 50 and a perforated mask 36 which serves to form a connection-surface arrangement 42 on inner end regions 26 of the conducting paths 21, 52. In another embodiment, with a view to forming a contact-surface metallization on the connection-surface arrangement 42, solder balls 41 are applied in holes 37 in the perforated mask 36.

In other embodiments of the invention, the conducting paths 21, 52 are exposed on a chip-contact side in the region of contact sections 25. In addition, the conducting paths 21, 52 are exposed on both sides in the region of contact sections 25. The contact sections 25 may also merge with outer end regions 53 of the conducting paths 52 that terminate in contact surfaces 54 and are arranged so as to diverge in the direction of the contact surfaces 54.

According to further alternative embodiments of the present invention, the support foil 20, 50 adjacent to the contact sections 25 includes a peripheral foil gap 55 in such a way that an inner region 24 of the support foil is connected to an outer region 32 of the support foil via several target-separation devices. In the alternative embodiment, the support foil 50 includes conducting paths 52 which, proceeding from the contact sections 25, have outer end regions 53 that extend over the foil gap 55 as far as the outer region 32 of the support foil.

DETAILED DESCRIPTION OF A PREFERRED EMBODIMENT

FIG. 1 shows, in a sectional representation, a support foil 20 which is provided on its reverse side with a conducting-path structure 22 comprising individual conducting paths 21. The support foil 20 may be a polyimide foil with conducting-path structuring (Kapton foil) that is used frequently in particular in the TAB process. In principle, however, use may also be made of other types of foil with a view to forming a chip support 23 described more precisely below, provided that by reason of their material properties they are suitable for the application of a conducting-path structure.

Figure 2:
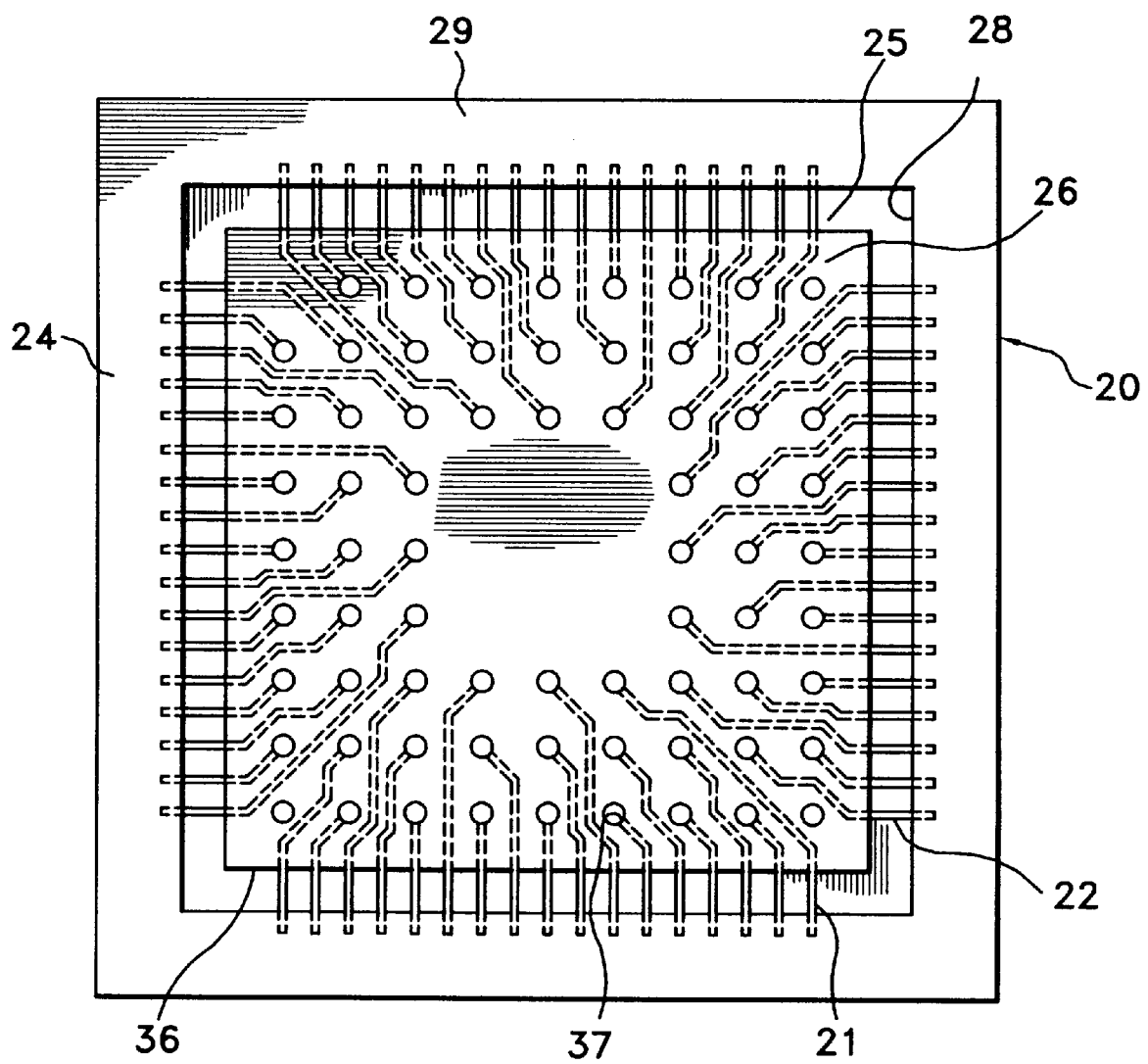
Figure 11:
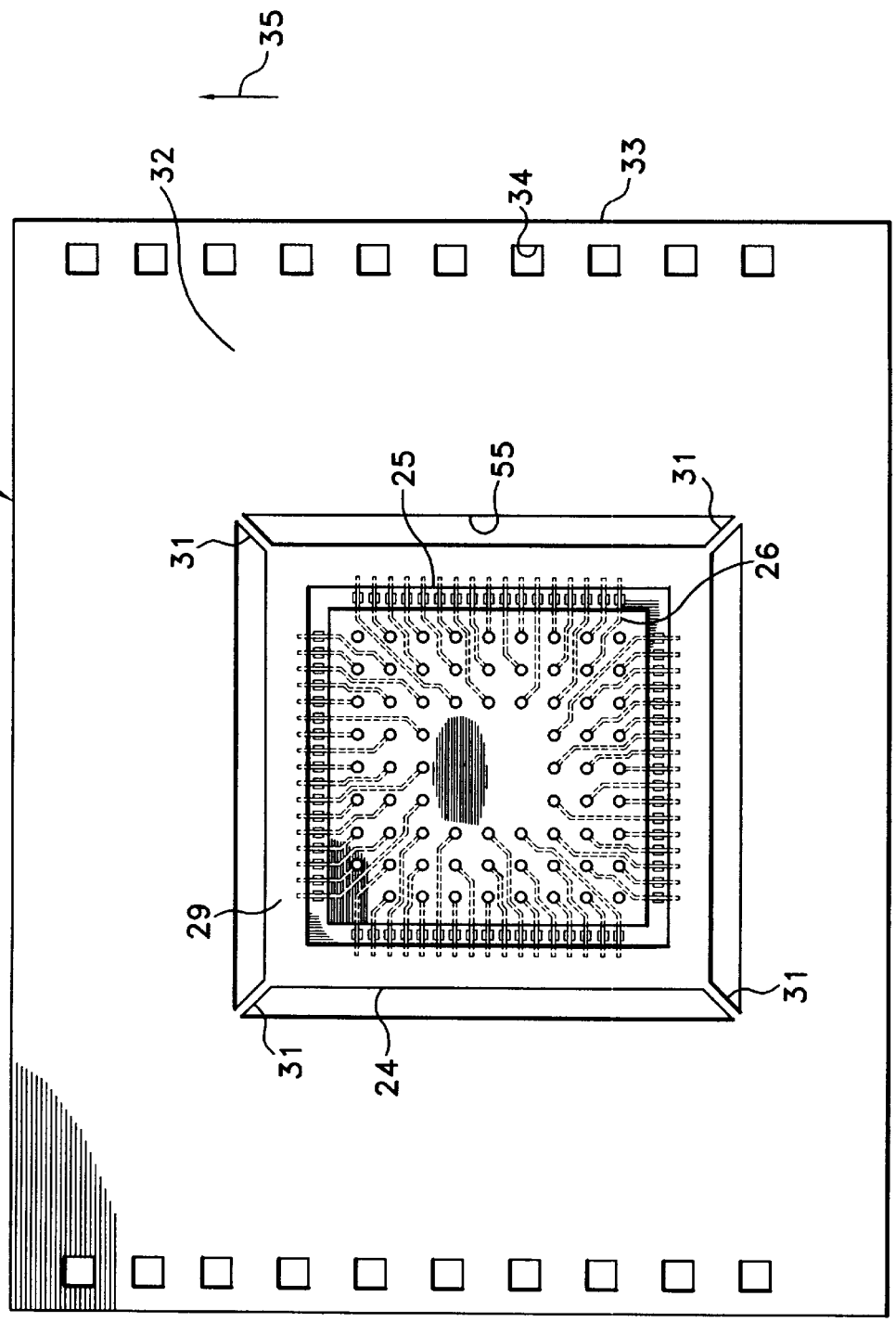

As can be seen in particular from FIG. 2, in which an inner region 24 of a support foil 20 represented in its entire with in FIG. 11 is depicted, the individual conducting paths 21 extend together with a contact section 25 which adjoins an inner end region 26 via a recess 28 in the inner region 24 of the support foil 20, said recess being constructed here peripherally in the form of a frame. In this manner the conducting paths 21 connect, in the embodiment example represented here, a foil frame 29 to a core region 30 (See FIG. 1) of the inner region 24 of the support foil 20. As FIG. 11 shows, the inner region 24 of the support foil 20 is connected in the corner regions of the foil frame 29 to an outer region 32 of the support foil 20 via target-separation bridges 31 which bridge a peripheral foil gap 55. The outer region 32 of the support foil 20 which is represented in a longitudinal section in FIG. 11 comprises on its longitudinal edges 33 a perforation 34 which is provided for the engagement of a traction device, not represented in any detail here, with a view to executing a feeding movement of the support foil 20 in the direction of the arrow 35.

As shown in FIG. 1, on the reverse side of the support foil 20 the conducting-path structure 22 is covered with a solder-stop mask 36 which is substantially congruent with the core region 30 of the support foil 20 arranged on the opposite side of the conducting-path structure 22. The solder-stop mask 36 may take the form of a coating, for example an application of solder-stop lacquer. It is essential that the solder-stop mask 36 forms a perforated mask with individual holes 37 which are each arranged above an inner end region 26 of a conducting path 21 and which consequently enable direct access to the respective conducting path 21 from the reverse side of the support foil 20. Of the plurality of holes 37 in the solder-stop mask 36 that are arranged in FIG. 2 in exemplary distribution over the conducting-path structure 22, only two are represented in FIG. 1 in an arrangement which, moreover, differs from the representation in FIG. 2.

In FIG. 1 a filler layer 38, formed for example from an adhesive material, is provided on the front side of the support foil 20, covering the core region 30, the function of said filler layer being elucidated more precisely below.

Figure 3:
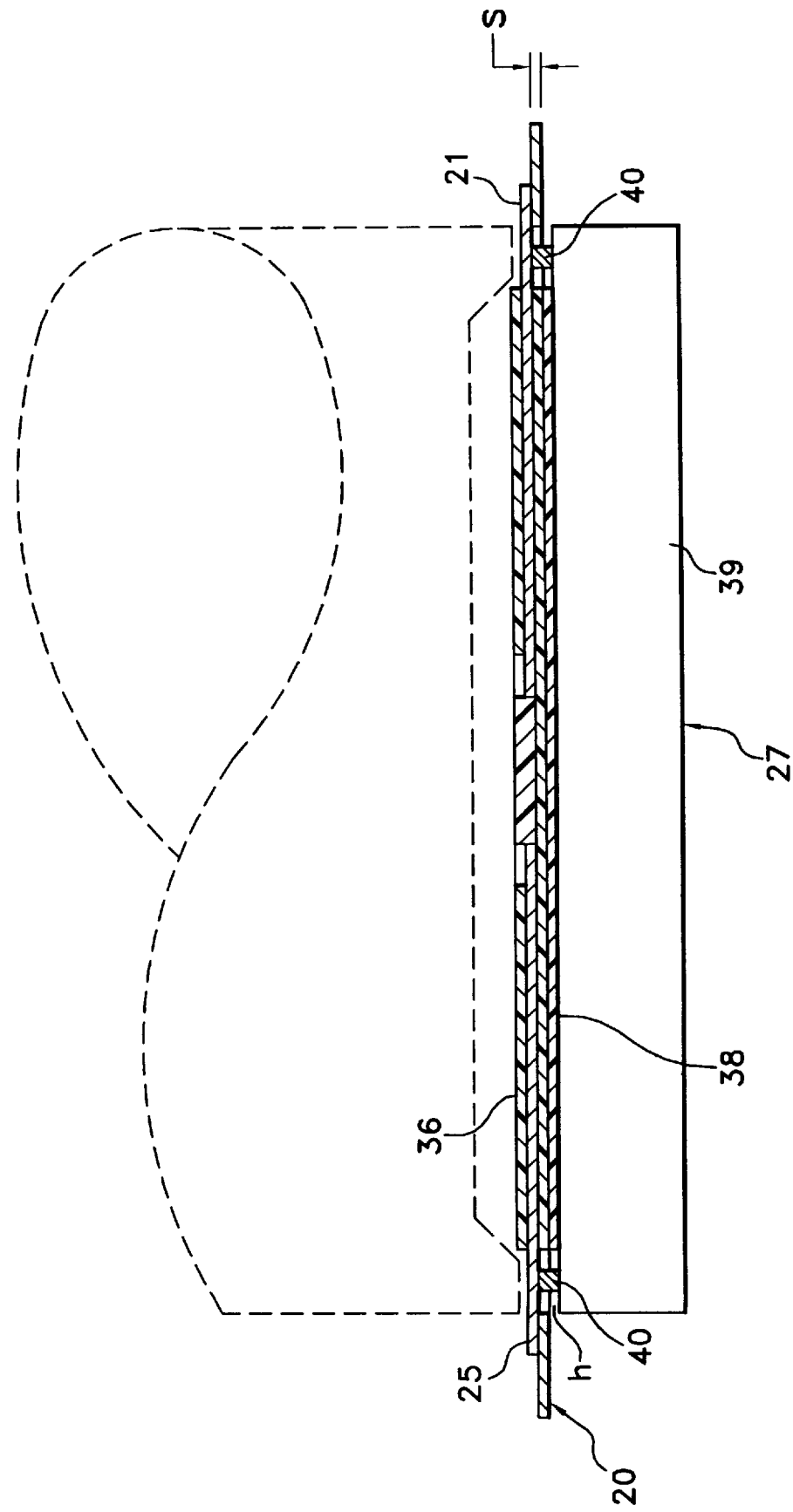

FIG. 3 shows the chip support 23 equipped with a chip 39 with a view to forming a chip-support arrangement 27, whereby the contact sections 25 of the conducting paths 21 are connected to contact-surface metallizations of the chip 39 that are designed as bumps 40. The bumps 40 may, for example, take the form of gold bumps or also gold/nickel bumps. The conducting paths may be designed as copper paths which may be provided in their end regions with a gold, gold/nickel or tin metallization for the purpose of connection to the bumps 40, as shown in FIGS. 3–10, and/or to solder balls 41, as shown in FIGS. 5–10. In each case the metallization can be matched to the relevant connection. The conducting paths 21 that are connected to the support foil 20 may be connected to the bumps 40 via a TAB process in which a thermode indicated by a dashed line in FIG. 3 can be mounted from the reverse side of the support foil 20 onto the contact sections 25 of the conducting paths and presses the latter, under pressure and the action of temperature, against the bumps 40 of the chip 39. In the course of this process the conducting paths 21 or the contact sections 25 thereof remain in plane-parallel arrangement in relation to the support foil 20, as is characteristic of the TAB process.

As is clearly evident from FIG. 3, the use of the TAB process is made possible, inter alia, by the fact that the foil thickness s is smaller than or may, at most, be as large as the height h of the bumps 40 protruding beyond the surface of the chip 39. For only in this way is a plane-parallel arrangement of the support foil 20 possible in relation to the surface of the chip. The filler layer 38 provided in FIG. 3 on the core region 30 of the support foil 20 serves to fill up an interspace that is otherwise present between the support foil 20 and the surface of the chip 39 and creates, by virtue of its adhesive properties, secure mechanical adhesion between the chip support 23 and the chip 39. In the case of an elastic design of the filler layer the latter also provides for mechanical damping between the chip support 23 and the chip 39 in the case of mechanical stress. In order to fill out the aforementioned interspace it is, however, equally possible to choose the foil thickness s in such a way that it corresponds to the height h of the bumps 40. This height amounts as a rule to about 25 μm.

FIG. 4 shows, once again in a top view, the contact sections 25 of the conducting paths 21 that are contacted by the bumps 40 of the chip 39.

From the representation according to FIG. 3 it also becomes clear that equipping of the chip support 23 is possible not only with the aid of TAB process but also with the aid of the flip-chip process. In this case the chip 39 is then mounted, with its bumps 40 forward, onto the contact sections 25 of the chip support 23 which is optionally arranged below the chip 39.

Figure 4:
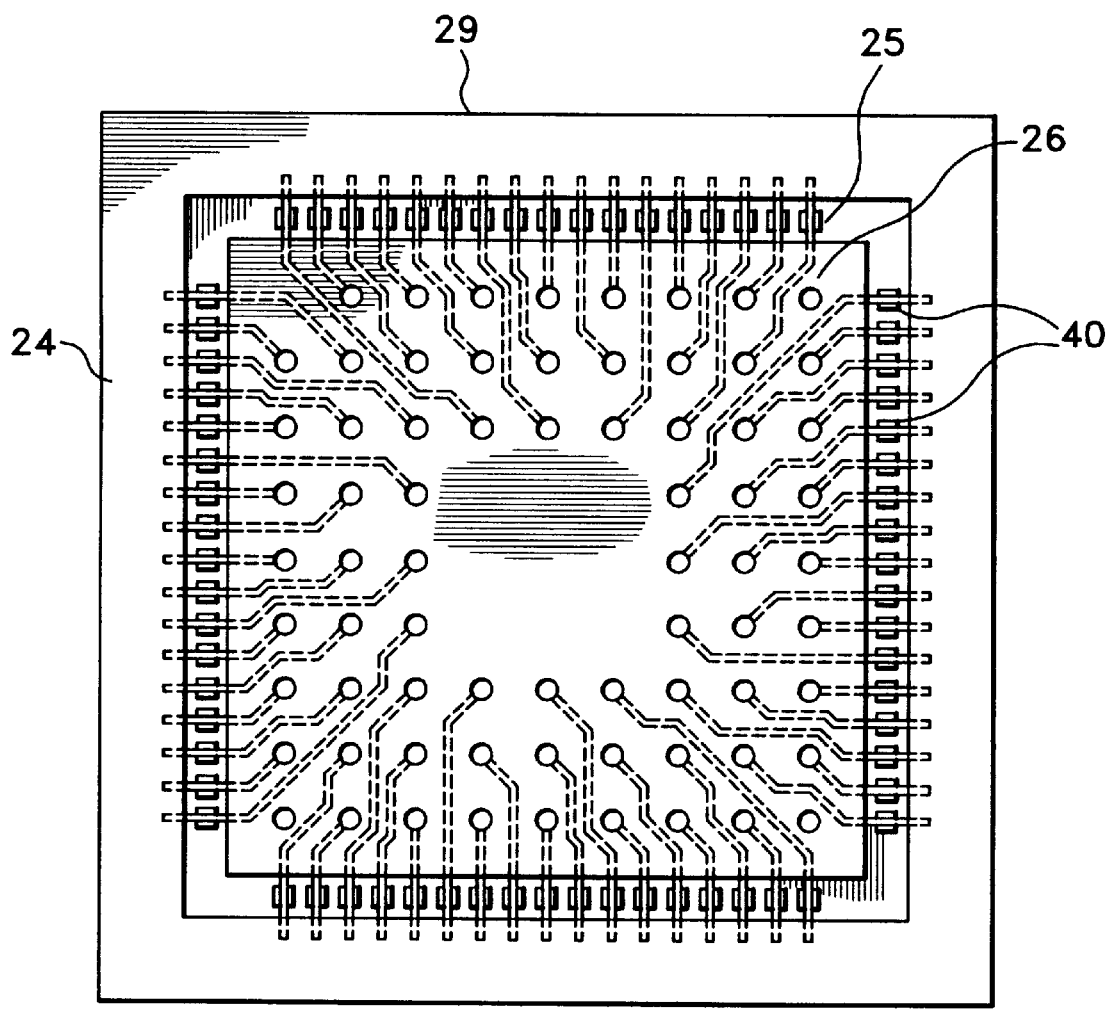
Figure 6:
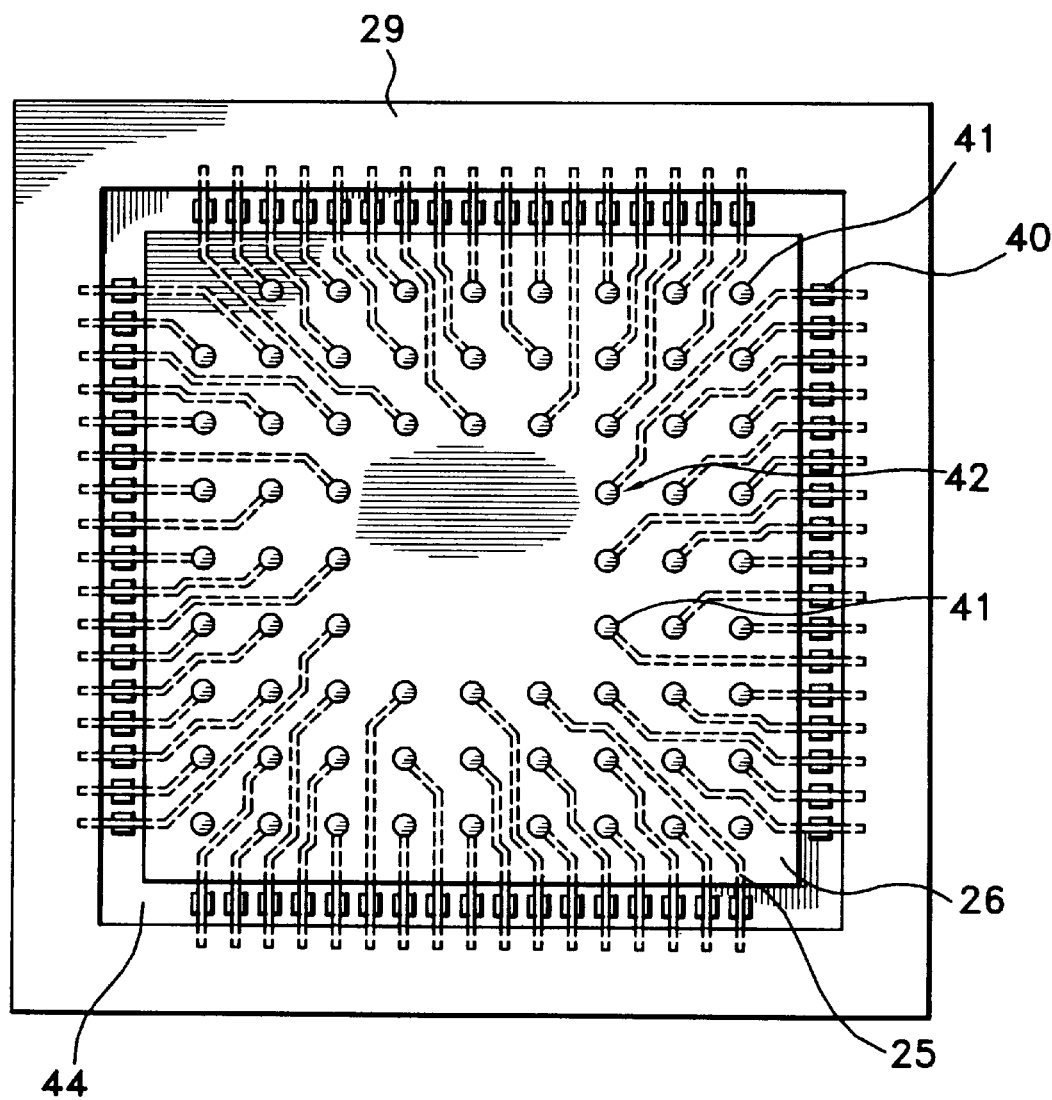

FIGS. 5 and 6 show the chip support 23 represented in FIGS. 3 and 4 after application of solder balls, so that in each case a solder ball 41 is arranged in the holes 37 of the solder-stop mask 36 with a view to forming a ball-grid array 42 which emerges particularly clearly from FIG. 6. The solder balls 41 arranged in the ball-grid array 42 serve for connection to an electronic component, for example a chip which is also arranged on a chip support having a ball-grid array with a view to generating a multi-chip structure or also for connection to a substrate. The connection to the additional component or the substrate may then be effected by remelting the solder balls 41 with the aid of the reflow process.

FIG. 7 shows the chip-support arrangement 27 represented in FIGS. 5 and 6 with a cast seal 43 which surrounds both a connecting region 44 created by the contacting of the conducting paths 21 with the bumps 40 and also the sides of the chip 39 and consequently forms a rigid chip casing 45 that is sealed off from environmental influences. The application of the cast seal 43 into the regions represented in FIG. 7 can be effected, for example, by the foil support 20 being transported through a bath of synthetic resin, which is not represented here in any detail.

FIG. 8 shows a variant differing from FIG. 7 to the effect that the arrangement of a filler layer 38 has been dispensed with and an interspace, already mentioned, that remains as a result between the support foil 20 and the surface of the chip is filled out in the course of application of the cast seal 43 by the sealing material that forms an underfilling 46.

FIG. 9 shows, finally, in a variant, a chip casing 47 in which, in addition to the cast seal 43 or an underfilling 46, a case 48 which is formed, for example, from synthetic material is pushed onto the chip 39 from the reverse side of the latter, whereby here an interspace remaining between an inner wall 49 of the case and the periphery of the chip is also filled out with the cast seal or the underfilling.

FIG. 10 shows, finally, the chip casing 47 which has been removed from the support foil 20 by severing the target-separation bridges 31 (FIG. 11) and which has consequently been isolated. The alternatives provided by way of example and represented in FIGS. 7 to 8 are isolated in the same manner.

Figure 12:
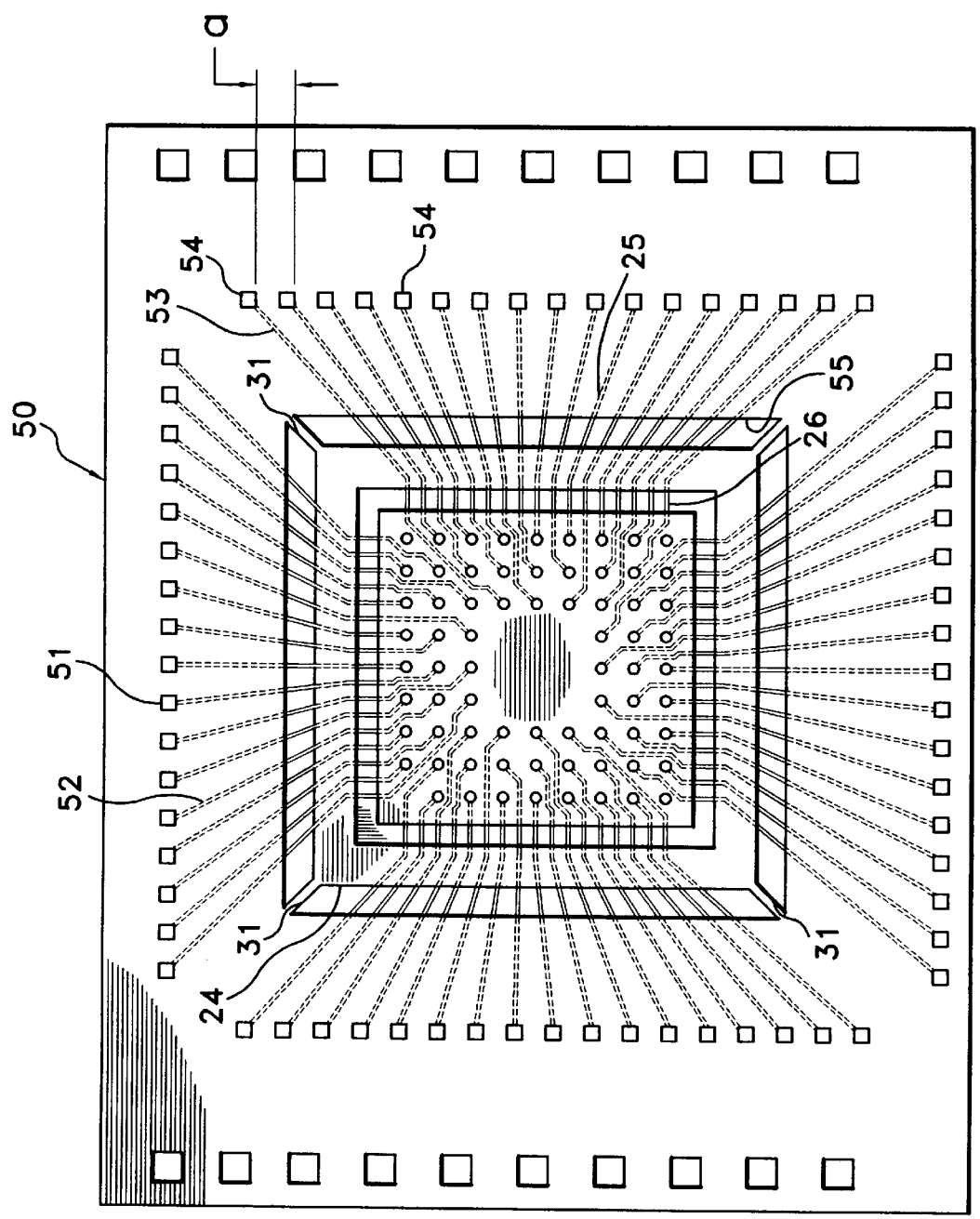

FIG. 12 shows, in an alternative embodiment, a support foil 50 which is provided with a conducting-path structure 51. The conducting-path structure 51 comprises conducting paths 52 which comprise, besides a central contact section 25 and an inner end region 26, an outer end region 53.

The differences in the support foil 50 represented in FIG. 12 become particularly clear in comparison with the support foil 20 represented in FIG. 11. FIG. 12 shows that the outer end regions 53 of the conducting paths 52 extend from the contact sections 25 spreading outwards as far as the outer region 32 of the support foil 50. The ends of the outer end regions 53 are designed as contact surfaces 54 which are arranged linearly relative to the length of each edge of the core region 30 of the support foil 50 and which exhibit a centre-to-centre distance a from one another that is substantially enlarged in comparison with the contact sections 25. By virtue of the substantially enlarged contact surfaces in comparison with the thickness of the conducting path and their relatively large spacing a from one another, contacting of the contact surfaces 54, for testing purposes for example, is made substantially simpler. As a consequence of the advantageous structure of the support foil 50 represented in FIG. 12 the contacting of the outer contact surfaces 54 may be effected at any time during the connection between the chip support 23 and the chip 39 or after completion of the chip casing 45 or 47 prior to the isolation thereof (see FIG. 10). In the course of the isolation of a chip casing 45 or 47 which has been manufactured by using a support foil 50 represented in FIG. 12, the outer end regions 53 of the conducting path 52 are detached together with the target-separation bridges 31, for instance by stamping.

We claim:

1. Chip-support arrangement with a chip support for the manufacture of a chip casing, said chip support being provided on a support foil with conducting paths which are connected on the front side of the support foil facing a chip to contact-surface metallizations of the chip and which with their free ends form a contact-surface arrangement distributed in planar manner for the purpose of connection to an electronic component or a substrate, characterised in that the conducting paths (21, 52) are arranged on the reverse side of the support foil (20, 50), whereby recesses (28) in the support foil (20, 50) are provided in the region of the contact-surface metallizations (40), and with a view to forming the connection-surface arrangement (42) the conducting paths (21, 52) are covered with a perforated mask (36), whereby the thickness of the support foil (20, 50) is smaller than or substantially equal to the height (h) of the contact-surface metallizations (40) on the surface of the chip.

2. Chip-support arrangement according to claim 1, characterised in that with a view to forming a contact-surface metallization on the connection-surface arrangement (42) solder balls (41) are applied in holes (37) in the perforated mask (36).

3. Chip-support arrangement according to claim 1, characterised in that with a view to forming a chip casing (45) at least one interspace that is present between the support foil (20, 50) and the surface of the chip (39) is provided with a filler (38, 46).

4. Chip-support arrangement according to claim 3, characterised in that with a view to forming a chip casing (47) the chip support (23) and the chip (39) are accommodated in a case (48), whereby interspaces present between an inner wall (49) of the case and the chip support (23) and also the chip (39) and the chip support (23) are filled out by the filler (38).

5. Chip support for the manufacture of a chip-support arrangement according to claim 1 with a support foil comprising conducting paths, characterised in that the conducting paths (21, 52) are arranged in the manner of a sandwich at least in a partial region between the support foil (20, 50) and a perforated mask (36) which serves to form a connection-surface arrangement (42) on inner end regions (26) of the conducting paths (21, 52).

6. Chip support according to claim 5, characterised in that with a view to forming a contact-surface metallization on the connection-surface arrangement (42) solder balls (41) are applied in holes (37) in the perforated mask (36).

7. Chip support according to claim 5, characterised in that the conducting paths (21, 52) are exposed on a chip-contact side in the region of contact sections (25).

8. Chip support according to claim 6, characterised in that the conducting paths (21, 52) are exposed on both sides in the region of contact sections (25).

9. Chip support according to claim 5 characterised in that the contact sections (25) merge with outer end regions (53) of the conducting paths (52) that terminate in contact surfaces (54) and are arranged so as to diverge in the direction of the contact surfaces (54).

10. Chip support according to claim 8, characterised in that the support foil (20, 50) adjacent to the contact sections (25) comprises a peripheral foil gap (55) in such a way that an inner region (24) of the support foil is connected to an outer region (32) of the support foil via several target-separation devices.

11. Chip support according to claim 10, characterised in that the support foil (50) comprises conducting paths (52) which, proceeding from the contact sections (25), comprise outer end regions (53) that extend over the foil gap (55) as far as the outer region (32) of the support foil.

* * * * *

UNITED STATES PATENT AND TRADEMARK OFFICE
CERTIFICATE OF CORRECTION

PATENT NO. : 5,956,232
DATED : September 21, 1999
INVENTOR(S) : Elke ZAKEL, et al.

It is certified that errors appear in the above-identified patent and that said Letters Patent is hereby corrected as shown below:

Foremost page, [73] Assignee, please add –D-80636 MUNICH, FED REP GERMANY –.

Signed and Sealed this

Seventeenth Day of April, 2001

Attest:

NICHOLAS P. GODICI

Attesting Officer

Acting Director of the United States Patent and Trademark Office